(12) United States Patent
Wei

(10) Patent No.: US 12,096,592 B2
(45) Date of Patent: Sep. 17, 2024

(54) HEAT DISSIPATION SUBRACK, HEAT DISSIPATION CABINET, AND BACKPLANE COMMUNICATION SYSTEM

(71) Applicant: ZTE CORPORATION, Guangdong (CN)

(72) Inventor: Jun Wei, Guangdong (CN)

(73) Assignee: XI'AN ZHONGXING NEW SOFTWARE CO., LTD., Shaanxi (CN)

(*) Notice: Subject to any disclaimer, the term of this patent is extended or adjusted under 35 U.S.C. 154(b) by 231 days.

(21) Appl. No.: 17/773,596

(22) PCT Filed: Nov. 2, 2020

(86) PCT No.: PCT/CN2020/125952
§ 371 (c)(1),
(2) Date: Apr. 29, 2022

(87) PCT Pub. No.: WO2021/088771
PCT Pub. Date: May 14, 2021

(65) Prior Publication Data
US 2022/0386505 A1    Dec. 1, 2022

(30) Foreign Application Priority Data

Nov. 6, 2019   (CN) .......................... 201911075828.2

(51) Int. Cl.
*H05K 7/20*    (2006.01)
*H04Q 1/02*    (2006.01)
(Continued)

(52) U.S. Cl.
CPC ......... *H05K 7/20145* (2013.01); *H04Q 1/025* (2013.01); *H04Q 1/035* (2013.01);
(Continued)

(58) Field of Classification Search
CPC ........... H05K 7/20009; H05K 7/20136; H05K 7/20145; H05K 7/20536; H05K 7/20554;
(Continued)

(56) References Cited

U.S. PATENT DOCUMENTS

| 8,257,156 B2* | 9/2012 | Shabany | ............ | H05K 7/20572 361/695 |
| 2005/0281014 A1* | 12/2005 | Carullo | ................ | H05K 7/1461 361/796 |

(Continued)

FOREIGN PATENT DOCUMENTS

| CN | 101790291 A | 7/2010 |
| CN | 203040083 U | 7/2013 |

(Continued)

OTHER PUBLICATIONS

ZTE Corporation, International Search Report with English Translation, PCT/CN2020/125952, Jan. 20, 2021, 6 pgs.

*Primary Examiner* — Zachary Pape
*Assistant Examiner* — Steven Ngo
(74) *Attorney, Agent, or Firm* — Li & Cai Intellectual Property (USA) Office

(57) ABSTRACT

Disclosed is a heat dissipation subrack, including a cabinet body defining an accommodating space. The cabinet body defines an air inlet, two air supplementing openings, and an air outlet. The accommodating space has an air inlet region, and a heat source region communicatively coupled to the air inlet region. An opening direction of the air inlet and an opening direction of each of the air supplementing openings intersect in the air inlet region. The cabinet body includes multiple baffles, each of the baffles includes two wind shielding surfaces, and airflow passages are defined between (Continued)

each two adjacent baffles and between one of inner walls of the cabinet body and an baffle adjacent to the one of the inner walls of the cabinet body.

19 Claims, 7 Drawing Sheets

(51) Int. Cl.
*H05K 5/02* (2006.01)
*H05K 7/18* (2006.01)

(52) U.S. Cl.
CPC .......... *H04Q 1/15* (2013.01); *H05K 7/20563* (2013.01); *H05K 7/20572* (2013.01); *H05K 5/0213* (2013.01); *H05K 7/186* (2013.01)

(58) Field of Classification Search
CPC .......... H05K 7/20563; H05K 7/20572; H05K 7/20709; H05K 7/20718; H05K 5/00; H05K 5/0004; H05K 7/00; H05K 7/1485; H05K 7/1497; H05K 7/183; H04Q 1/025; H04Q 1/035; H04Q 1/15
See application file for complete search history.

(56) References Cited

U.S. PATENT DOCUMENTS

| | | | | |
|---|---|---|---|---|
| 2007/0258211 | A1* | 11/2007 | Sonobe | H05K 7/20572 361/695 |
| 2008/0094799 | A1* | 4/2008 | Zieman | F28F 9/0268 361/695 |
| 2009/0061755 | A1* | 3/2009 | Calder | H05K 7/20736 361/692 |
| 2014/0138069 | A1* | 5/2014 | Hao | G06F 1/20 165/121 |
| 2017/0112023 | A1* | 4/2017 | Mao | H05K 7/20745 |

FOREIGN PATENT DOCUMENTS

| | | |
|---|---|---|
| CN | 105451517 A | 3/2016 |
| CN | 107282583 A | 10/2017 |
| CN | 107506004 A | 12/2017 |
| CN | 108541196 A | 9/2018 |
| CN | 109114856 A | 1/2019 |
| CN | 208581445 U | 3/2019 |
| EP | 0752561 A1 | 1/1997 |
| WO | 1987000261 A1 | 1/1987 |

* cited by examiner

HEAT DISSIPATION SUBRACK, HEAT DISSIPATION CABINET, AND BACKPLANE COMMUNICATION SYSTEM

CROSS REFERENCE TO RELATED APPLICATIONS

This application is a United States National Stage Application filed under 35 U.S.C. § 371 of PCT Patent Application Serial No. PCT/CN2020/125952, filed Nov. 2, 2020, which claims priority to Chinese patent application No. 201911075828.2 filed on Nov. 6, 2019, each of which is hereby incorporated by reference in its entirety.

TECHNIC FIELD

Embodiments of the disclosure relate to the field of communication equipment, and more particularly to a heat dissipation subrack for communication equipment, a heat dissipation cabinet with the heat dissipation subrack, and a backplane communication system.

BACKGROUND

With the continuous development of backplane communication technology, heat dissipation requirements on various equipment for backplane communication are increasingly increased. Therefore, heat dissipation subracks with air inlets and air outlets are widely used in backplane communication equipment to cool communication backplanes by airflow flowing through the heat dissipation subrack. However, due to limitation of the backplane communication technology, large-scale routing switching equipment in the communication equipment is relatively sensitive to a height of a whole machine with the heat dissipation subrack. That is, with respect to great increasing of capacity and power consumption of the whole machine, a height of the air inlet and the air outlet may be only increased slightly. Therefore, how to improve heat dissipation effect of the communication equipment is a technical problem to be solved in the backplane communication technology.

SUMMARY

Embodiments of the present disclosure aim to provide a heat dissipation subrack, a heat dissipation cabinet, and a backplane communication system. In order to solve the above-mentioned technical problem, in some embodiments, a heat dissipation subrack is provided. The heat dissipation subrack includes a cabinet body defining an accommodating space. The cabinet body defines an air inlet, two air supplementing openings on both sides of the air inlet, and an air outlet. The accommodating space includes an air inlet region directly facing the air inlet and the two air supplementing openings, and a heat source region communicatively coupled to the air inlet region to allow airflow therebetween. The air inlet has a first opening direction, and each of the air supplementing openings has a second opening direction, and the first opening direction and the second opening direction intersect in the air inlet region. The cabinet body includes multiple baffles disposed in the air inlet region and spaced apart from one another. Each of the baffles includes two wind shielding surfaces, one of the two wind shielding surfaces faces one of the two air supplementing openings, and the other of the two wind shielding surfaces faces the other of the two air supplementing openings. Airflow passages facing the air inlet and communicatively coupling the air inlet region with the heat source region to allow airflow therebetween are respectively defined between each two adjacent baffles as well as between one of inner walls of the cabinet body and a baffle adjacent to the one of the inner walls of the cabinet body.

In some embodiments, a heat dissipation cabinet is further provided. The heat dissipation includes two heat dissipation subracks described above. The cabinet body of one of the two heat dissipation subracks is stacked on the cabinet body of the other of the two heat dissipation subracks.

In some embodiments, a backplane communication system is further provided. The backplane communication system includes at least one backplane, at least one heating element disposed on the at least one backboard, and the aforementioned heat dissipation subrack or heat dissipation cabinet, where the backboard is disposed in the accommodating space.

BRIEF DESCRIPTION OF THE DRAWINGS

One or more embodiments are illustrated with reference to pictures in corresponding accompanying drawings, which do not constitute limitations on the embodiments. Elements with same reference numerals in the accompanying drawings are denoted as similar elements. Unless otherwise stated, the pictures in the accompanying drawings do not constitute a scale limitation.

DETAILED DESCRIPTION OF THE EMBODIMENTS

Figure 1:
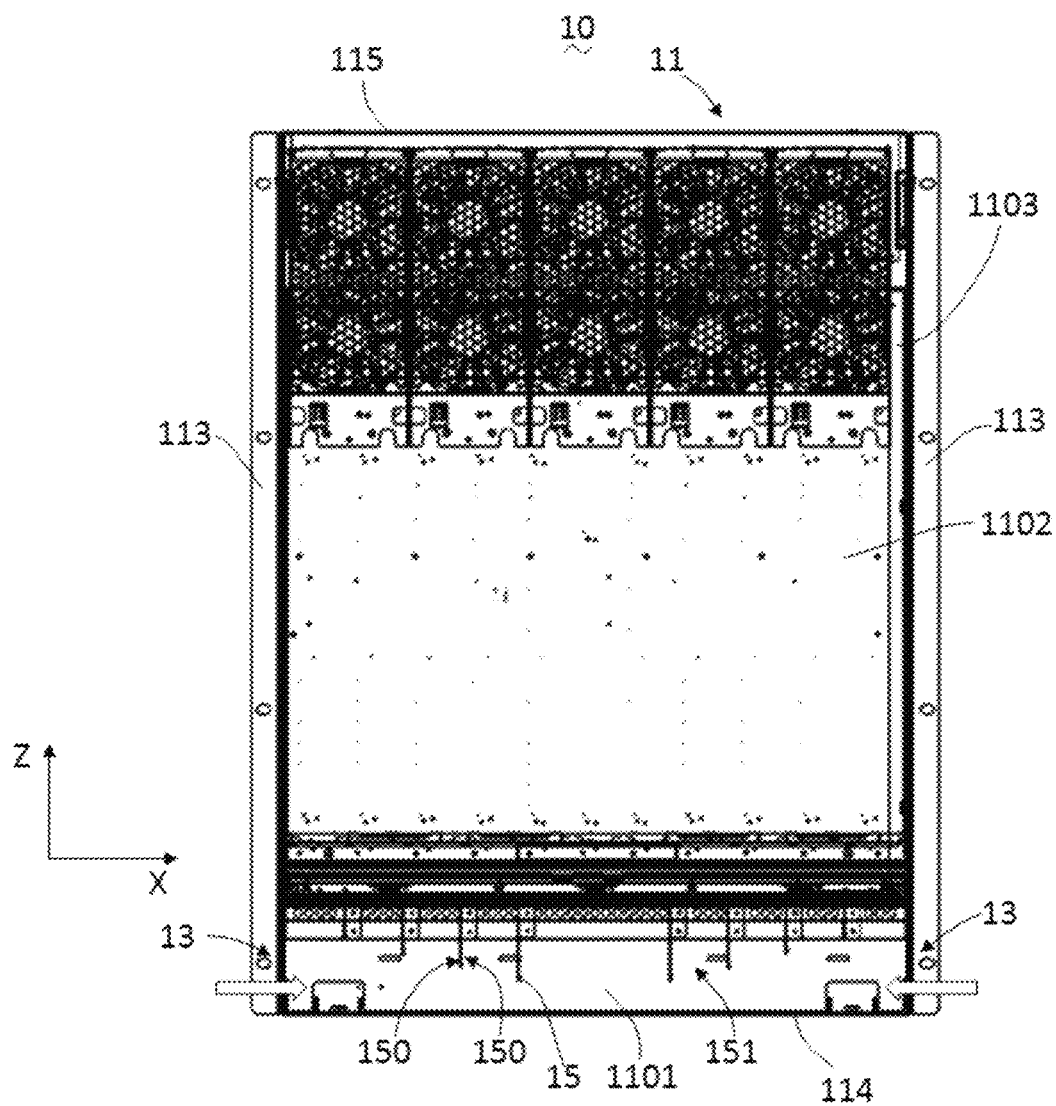
FIG. 1 is a front view of a heat dissipation subrack according to a first embodiment of the present disclosure.

In order to describe objectives, technical solutions, and advantages of the embodiments of the present disclosure clearer, embodiments of the present disclosure will be described in detail below with reference to accompanying drawings. Those of ordinary skill in the art could understand that many technical details are provided in various embodiments of the present disclosure for the reader to better understand the present disclosure. However, even without these technical details and various changes and modifications based on the following embodiments, the technical solution claimed in the present disclosure can also be realized.

To increase an inlet air volume of a heat dissipation subrack, there are generally two design schemes.

For scheme A: in some heat dissipation subracks, a new backplane connection technology is developed to reduce system wind resistance, which relies on a panel to import wind and follows a strict front-inlet rear-outlet air duct. In addition, a higher requirement on wind pressure and noise of a fan needs to be met. Furthermore, the higher a capacity of a single board, the greater a power consumption of the single board, and the greater the wind resistance, the less an air volume, which are contradictory in design.

For scheme B: in other heat dissipation subracks, openings are defined on both side walls of the heat dissipation subracks to supplement air, and a side cabinet or an air guide frame is used to form a non-strict front-inlet rear-outlet air duct, which can be applied in computer room environment. Under an existing printed circuit board (PCB) backplane connection structure, the complex air passage form may exist for a long time. However, due to squeezing of side inlet air on front inlet air, following problems may arise.

1. Eddy current is easily formed at a rear of the side inlet air, resulting in a low-speed region.
2. The inlet air is concentrated in a middle slot, and an air volume in a side slot is low.
3. A negative pressure of the side inlet air may lead to generation of heat recirculation inside a cabinet, which may further affect heat dissipation of the side slot.

In order to improve heat dissipation effect, a first embodiment of the present disclosure relates to a heat dissipation subrack. The heat dissipation subrack includes a cabinet body defining an accommodating space. The cabinet body defines an air inlet, two air supplementing openings respectively disposed on both sides of the air inlet, and an air outlet. The accommodating space includes an air inlet region directly facing the air inlet and the two air supplementing openings, and a heat source region communicatively coupled to the air inlet region to allow airflow therebetween. The air inlet has a first opening direction, and each of the two air supplementing openings has a second opening direction. The first opening direction and the second opening direction intersect in the air inlet region. The cabinet body includes baffles disposed in the air inlet region and spaced apart from one another. Each of the baffles includes two wind shielding surfaces respectively facing the two air supplementing openings. Airflow passages facing the air inlet and communicatively coupling the air inlet region with the heat source region to allow airflow therebetween are respectively defined between each two adjacent baffles as well as between one of inner walls of the cabinet body and a baffle adjacent to the one of the inner walls of the cabinet body.

The heat dissipation subrack defines the air inlet for introducing front inlet air and the air supplementing openings for introducing side inlet air. The baffles are provided at a junction (that is, a junction of an opening direction of the air inlet and an opening direction of the air supplementing openings, i.e., in the air inlet region) of the front inlet air and the side inlet air. Since the baffle has the wind shielding surfaces facing the air supplementing openings, the wind shielding surfaces may block a part of airflow of the side inlet air from the air supplementing openings, and introduce the part of the airflow to the heat source region via the airflow passage on one side of the baffle. In this way, during the airflow of the side inlet air blowing from an edge of the heat dissipation subrack to a central region of the heat dissipation subrack, the airflow of the side inlet air may be blocked by the multiple baffles disposed at intervals in turn and shunted to one or more airflow passages that are closest to, slightly farther, and farther from the edge of the heat dissipation subrack in turn, which may have following effects.

1. Since the airflow of the side inlet air flowing to the heat dissipation subrack is shunted to the airflow passages at the edge of the heat dissipation subrack and then enter the heat source region, an airflow volume of the side inlet air reaching the middle of the heat dissipation subrack may be reduced, and impact of the side inlet air on the front inlet air in the middle of the heat dissipation subrack may be alleviated, thereby alleviating squeezing of the side inlet air on the front inlet air. In addition, the eddy current may be reduced, and influence of a low-speed airflow region caused by the eddy current on the heat dissipation effect may be reduced.
2. Since partial airflow shunted increases the volume of the inlet air flowing into the heat source region from the edge of the heat dissipation subrack, uneven heat dissipation caused by the airflow concentrated in the middle of the heat dissipation subrack may be improved.
3. Due to an increased inlet air volume at the edge of the heat dissipation subrack, a negative pressure caused by insufficient airflow at the edge of an existing heat dissipation subrack may be alleviated, and the heat recirculation caused by the negative pressure may be alleviated. Thus, heat dissipation effect of communication equipment may be effectively improved.

The implementation details of the heat dissipation subrack in embodiment are described in detail below. The following contents are provided for the convenience of understanding only, and are not necessary for implementing this solution.

Figure 2:
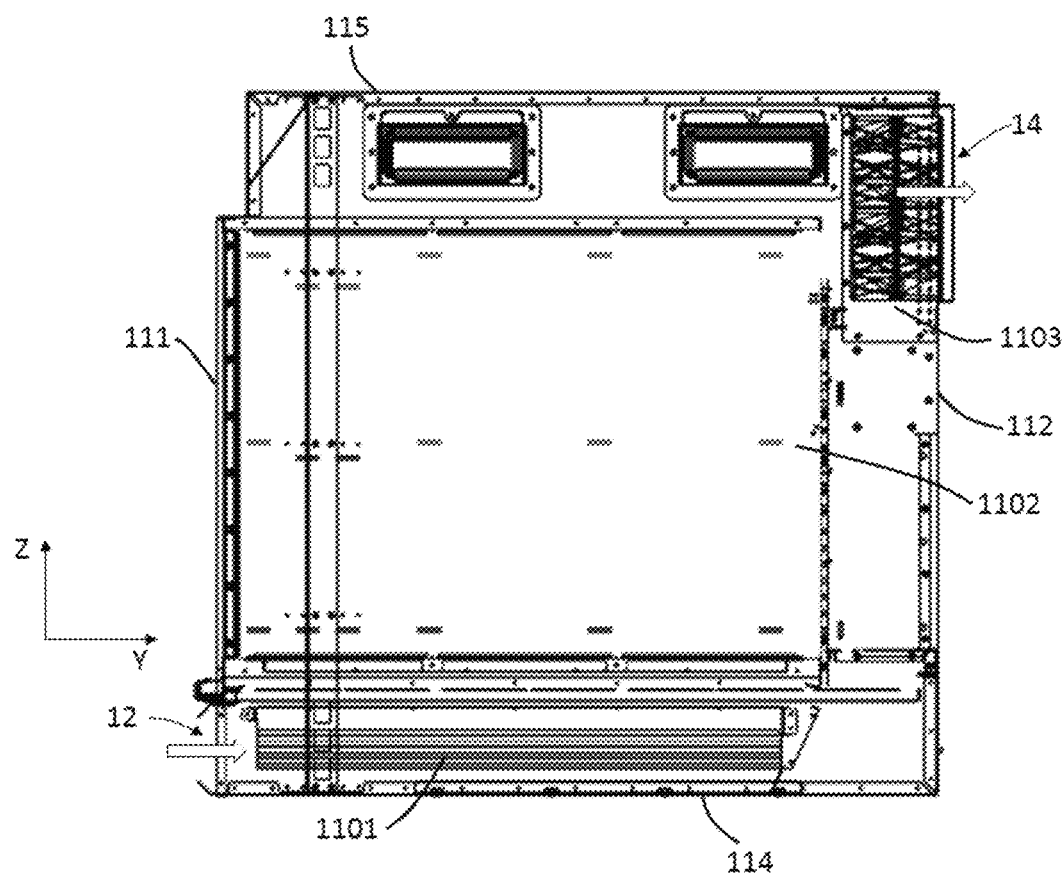
FIG. 2 is a right view of the heat dissipation subrack according to the first embodiment of the present disclosure.

Referring to FIG. 1 and FIG. 2, a heat dissipation subrack 10 in embodiments includes a cabinet body 11, an air inlet 12, air supplementing openings 13, an air outlet 14, and baffles 15 located in the cabinet body 11. The air inlet 12, the air supplementing openings 13, and the air outlet 14 are defined on the cabinet body 11.

The cabinet body 11 includes a front panel 111 and a rear panel 112 that are disposed opposite to each other, two side panels 113, a bottom panel 114, and a top panel 115 located above the bottom panel 114. The two side panels 113 are respectively connected with the front panel 111 and the rear panel 112 and are arranged opposite to each other. The bottom panel 114 is located below the front panel 111, the rear panel 112, and the side panels 113. The front panel 111, the rear panel 112, the two side panels 113, the bottom panel 114, and the top panel 115 cooperatively define an accommodating space 110. The accommodating space 110 is used for accommodating a communication backplane (not illustrated in the figure) provided with at least one heating element.

The air inlet 12 is defined on the front panel 111 and is used for introducing the front inlet air from a front (a side of the front panel 111) of the cabinet body 11 so as to perform heat dissipation on the at least one heating element in the accommodating space 110. In FIG. 2, upward and downward directions are Z-axis directions (the upward direction is a Z-axis positive direction), leftward and rightward directions are Y-axis directions (the rightward direction is a Y-axis positive direction), and directions perpendicular to a surface of the figure are X-axis directions (no X-axis is illustrated in FIG. 2, and a direction that is perpendicular to the surface of the figure and outward is a X-axis positive direction). In a YZ plane, an opening direction of the air inlet 12 is the Y-axis direction (hereinafter referred to as a first opening direction) illustrated in FIG. 2. In embodiments, the air inlet 12 is disposed adjacent to the bottom panel 114. That is, when the cabinet body 11 is placed horizontally (in a vertical direction perpendicular to a horizontal plane, the bottom panel 114 is located below the top panel 115), the air inlet 12 is defined at the bottom of the front panel 111.

The two air supplementing openings 13 are located on both sides of the air inlet 12 and are respectively defined on the two opposite side panels 113. The air supplementing opening 13 is used for introducing side inlet air from a side (a side of the side panel 113) of the cabinet body 11, to supplement the front inlet air, which may increase airflow entering the accommodating space 110, thereby improving the heat dissipation effect. In FIG. 1, the upward and downward directions are the Z-axis directions (the upward direction is the Z-axis positive direction), the leftward and rightward directions are X-axis directions (the rightward direction is the X-axis positive direction), and directions perpendicular to the surface of the figure are Y-axis directions (no Y-axis is illustrated in FIG. 2, and a direction that is perpendicular to the surface of the figure and inward is the Y-axis positive direction). In a XZ plane, an opening direction of the air supplementary opening 13 is the X-axis direction (hereinafter referred to as a second opening direction) illustrated in FIG. 1. The first opening direction of the air inlet 12 and the second opening direction of the air supplementing opening 13 intersect in an air inlet region 1101. The front inlet air introduced from the air inlet 12 and the side inlet air introduced from the supplementary air inlets 13 may meet in the air inlet region 1101. In embodiments, the two air supplementing openings 13 are disposed adjacent to the bottom panel 114. It is to be noted that, in actual use, if it is necessary to ensure that airflow introduction positions of the side inlet air are symmetrical, the two air supplementing openings 13 may be disposed opposite to each other.

The accommodating space 110 includes the air inlet region 1101 directly facing the air inlet 12 and the two air supplementing openings 13, and a heat source region 1102 communicatively coupled to the air inlet region 1101 to allow airflow therebetween. In embodiments, the air inlet region 1101 is disposed adjacent to the bottom panel 114. When the cabinet body 11 is placed horizontally, the heat source region 1102 is located above the air inlet region 1101 in the vertical direction perpendicular to the horizontal plane.

The air outlet 14 communicates with the air inlet 12 and the air supplementing openings 13 via the heat source region 1102 and the air inlet region 1101 in turn, thereby discharging hot airflow which is obtained after airflow enters the accommodating space 110 via the air inlet 12 and the air supplementing openings 13 and then heat exchange is conducted with air from the heating element. The air outlet 14 is defined at the top of the cabinet body. The air outlet 14 may be defined on any of the top panel 115, the two side panels 113, the front panel 111, and the rear panel 112. There may be one or more air outlets 14. In embodiments, one air outlet 14 is defined. The air outlet 14 is defined on the rear panel 112 and adjacent to the top panel 115, that is, the air outlet is defined at the top of the cabinet body 11.

Figure 3:
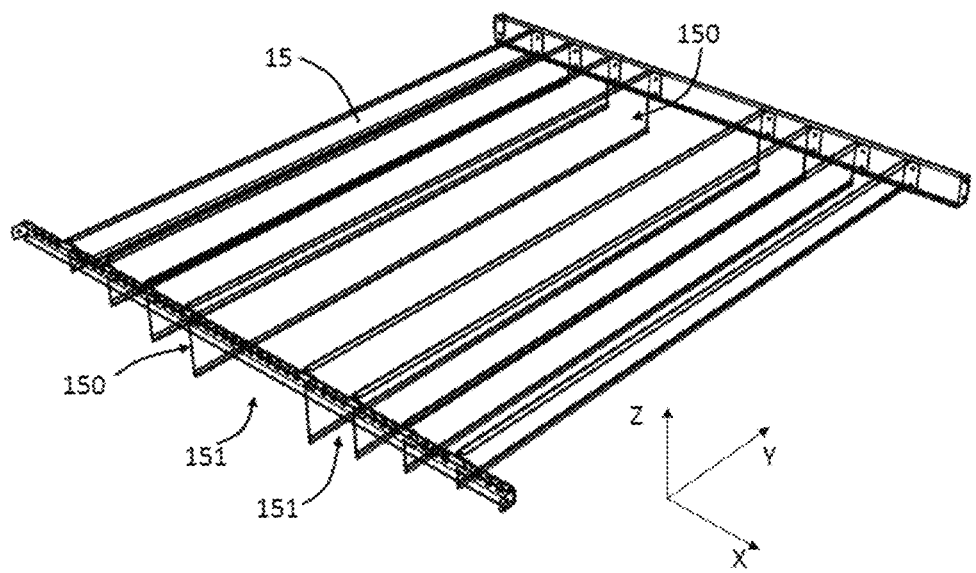
FIG. 3 is a schematic perspective view of a baffle according to the first embodiment of the present disclosure.

There may be multiple baffles 15. The multiple baffles 15 are disposed in the air inlet region 1101 at intervals. Referring to FIG. 3, each of the baffles 15 includes two wind shielding surfaces 150 respectively facing the two air supplementary openings 13. An airflow passage 151 facing the air inlet 12 is defined between each two adjacent baffles 15, and an airflow passage 151 facing the air inlet 12 is also defined between one of inner walls (not illustrated in the figure, e.g., a side of the side panel 113 facing the accommodating space 110) of the cabinet body 11 and the baffle 15 adjacent to the one of the inner walls of the cabinet body 11, so that the airflow passage 151 communicates the air inlet region 1101 and the heat source region 1102.

Figure 4:
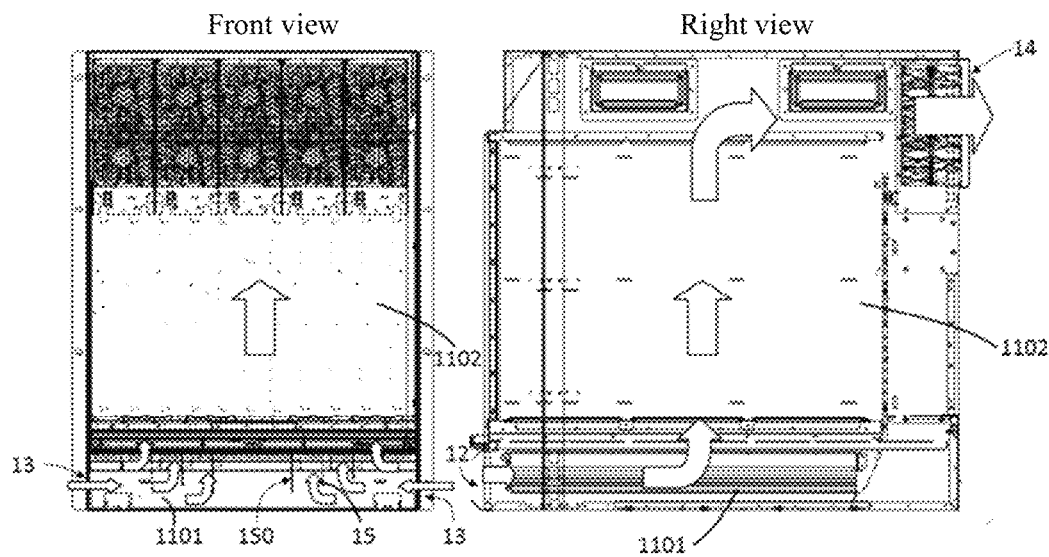
FIG. 4 is a schematic diagram of an airflow guidance of the heat dissipation subrack according to the first embodiment of the present disclosure.

Referring to FIG. 4, since the wind shielding surface 150 may block a part of the airflow of the side inlet air from the air supplementing opening 13 and introduce the part of the airflow to the heat source region 1102 through the airflow passage 151 located on one side of the baffle 15. In this way, during the airflow of the side inlet air (along X-axis positive and negative directions illustrated in FIG. 4) blowing from an edge of the heat dissipation subrack 10 to a central region of the heat dissipation subrack 10, the airflow of the side inlet air may be blocked by the multiple baffles 15 disposed at intervals in turn and shunted to the airflow passages 151 which are closest to, slightly farther, and farther from the edge of the heat dissipation subrack 10.

Since the airflow of the side inlet air flowing to the heat dissipation subrack 10 is shunted to the airflow passages 151 at the edge of the heat dissipation subrack 10 and then enter the heat source region 1102, the airflow volume of the side inlet air reaching the middle of the heat dissipation subrack 10 may be reduced, and impact of the side inlet air on the front inlet air in the middle of the heat dissipation subrack 10 is alleviated, thereby alleviating squeezing of the side inlet air on the front inlet air. In addition, the eddy current may be reduced, and the low-speed airflow region caused by the eddy current on the heat dissipation effect may be reduced. Furthermore, since the partial airflow shunted increases the volume of inlet air flowing into the heat source region 1102 from the edge of the heat dissipation subrack 10, the uneven heat dissipation caused by the airflow concentrated in the middle of the heat dissipation subrack 10 may be improved. Due to an increased inlet air volume at the edge of the heat dissipation subrack 10, the negative pressure caused by insufficient airflow at the edge of the heat dissipation subrack 10 may be alleviated, and the heat recirculation caused by the negative pressure may be alleviated, such that the heat dissipation effect may be effectively improved.

Figure 5:
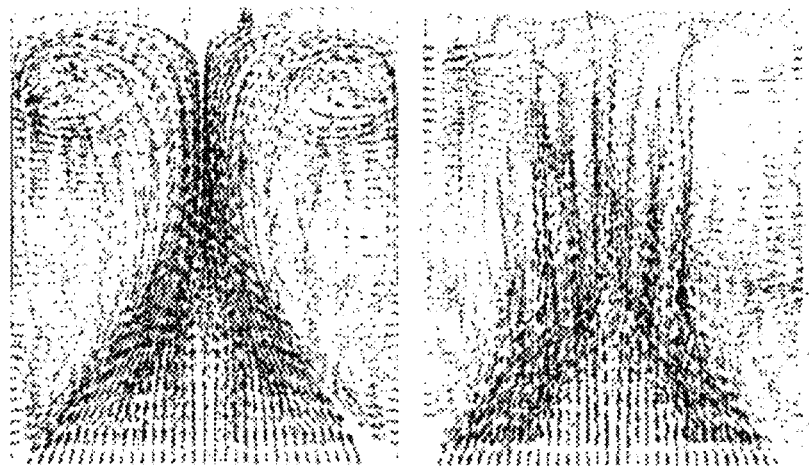
FIG. 5 is a comparison diagram of an air inlet flow field (left) of an existing heat dissipation subrack and an air inlet flow field (right) of a heat dissipation subrack according to the first embodiment of the present disclosure.

FIG. 5 is a comparison diagram of air inlet flow fields in the related art and in embodiments. The left side in FIG. 5 illustrates an air inlet flow field of an existing heat dissipation subrack, and the right side in FIG. 5 illustrates an air inlet flow field of the heat dissipation subrack of the present embodiments. In FIG. 5, a density of black dots represents a density of gas molecules or an airflow volume. It can be seen that with the baffle of the heat dissipation subrack in embodiments, distribution of the flow field may be significantly improved, and the eddy current may be reduced, such that the low-speed region at the edge of the cabinet body may be significantly improved. Experimental data shows that the heat dissipation capability of the heat dissipation subrack provided in embodiments can be improved by 30-70%.

It can be understood that the multiple baffles 15 blocks and shunts the side inlet air through the wind shielding surfaces 150, and guides the front inlet air and the shunted side inlet air through the airflow passages 151 defined by the baffles disposed at intervals. Therefore, on the premise that the wind shielding surfaces 150 (i.e., a panel surface) of the multiple baffles 15 face the air supplementing openings 13, and there are gaps between the multiple baffles 15 for airflow to pass through, the baffles 15 may be designed to have different structures according to different considerations, such as process requirements and customer needs.

For example, the multiple baffles 15 may be disposed in parallel to each other or obliquely. In embodiments, the multiple baffles are arranged in parallel. In this way, the airflow passages 151 defined between the baffles 15 are relatively regular (i.e., each airflow passage has a constant width), which ensures that the airflow volume at each position of the airflow passage 151 is substantially equal, so that the airflow distribution of airflow in each airflow passage 151 is relatively uniform. For another example, the multiple baffles 15 may also be parallel to the first opening direction. In this way, an extending direction of the baffle 15 coincides with a direction of inlet airflow of the air inlet 12, which may reduce a wind resistance of the inlet airflow of the air inlet 12 flowing to the airflow passage 151 and keep the airflow unobstructed. In embodiments, the multiple baffles 15 may also be disposed to be perpendicular to the second opening direction. In this way, the wind shielding surfaces 150 of the baffles 15 are perpendicular to an inlet airflow direction of the air supplementing openings, which may enhance blocking and shunting effects on the side inlet air. In addition, a width of each of the airflow passages 151 in the second opening direction may be set to be the same, so that an air volume of each of the airflow passages 151 is more uniform. In embodiments, the airflow passages 151 have different widths in the second opening direction. The airflow passage 151 located at the central region of the air inlet region 1101 has a first width in the second opening direction, and the at least one airflow passage 151 located at a non-central region of the air intake region 1101 has a second width in the second opening direction, where the first width is larger than the second width.

In addition, for the convenience of fabrication, the multiple baffles 15 may be set to have a same size (i.e., the wind shielding surfaces 150 have a same area). In this way, baffles 15 may be manufactured in batches and assembled in different positions in the air inlet region 1101 to achieve corresponding wind-shielding and diversion effects.

In this embodiment, areas of the wind shielding surfaces 150 of the multiple baffles 15 increases sequentially along a direction (i.e., a direction from both sides of the cabinet body 11 toward the center of the cabinet body 11) away from the air supplementary openings 13. Since the central region of the air inlet region 1101 is far away from the air supplementing openings 13, and airflow received from the air supplementing openings is relatively small. Thus, increasing the area of the wind shielding surface 150 at the central region may enable to receive and guide the airflow of the side inlet air in a larger range (along the Z-axis direction), thereby avoiding that airflow at the central region of the air inlet region 1101 is relatively small. Specifically, during actual manufacturing, the multiple baffles 15 may have the same length in the first opening direction and different heights in a direction (i.e., the Z-axis direction) perpendicular to the first opening direction and the second opening direction, so that the baffles 15 may have wind shielding surfaces 150 of different sizes.

It is to be noted that to achieve same blocking and guiding effects on the airflow of the two air supplementing openings 13 and to ensure the uniformity of distribution of the airflow, in embodiments, the multiple baffles 15 are symmetrically disposed on both sides of the airflow passage 151 located at the central region of the air inlet region 1101.

In addition, to facilitate flowing out of airflow in the heat dissipation subrack 10 after the heat exchange, the accommodating space 110 may further include a fan region 1103 for accommodating a fan and adjacent to the air outlet 14. An air inlet side of the fan region 1103 faces the heat source region, and an air outlet side of the fan region 1103 faces the air outlet 14, so that hot airflow in the heat source region may be driven by the fan disposed in the fan region 19 to flow out through the air outlet 14.

Figure 6:
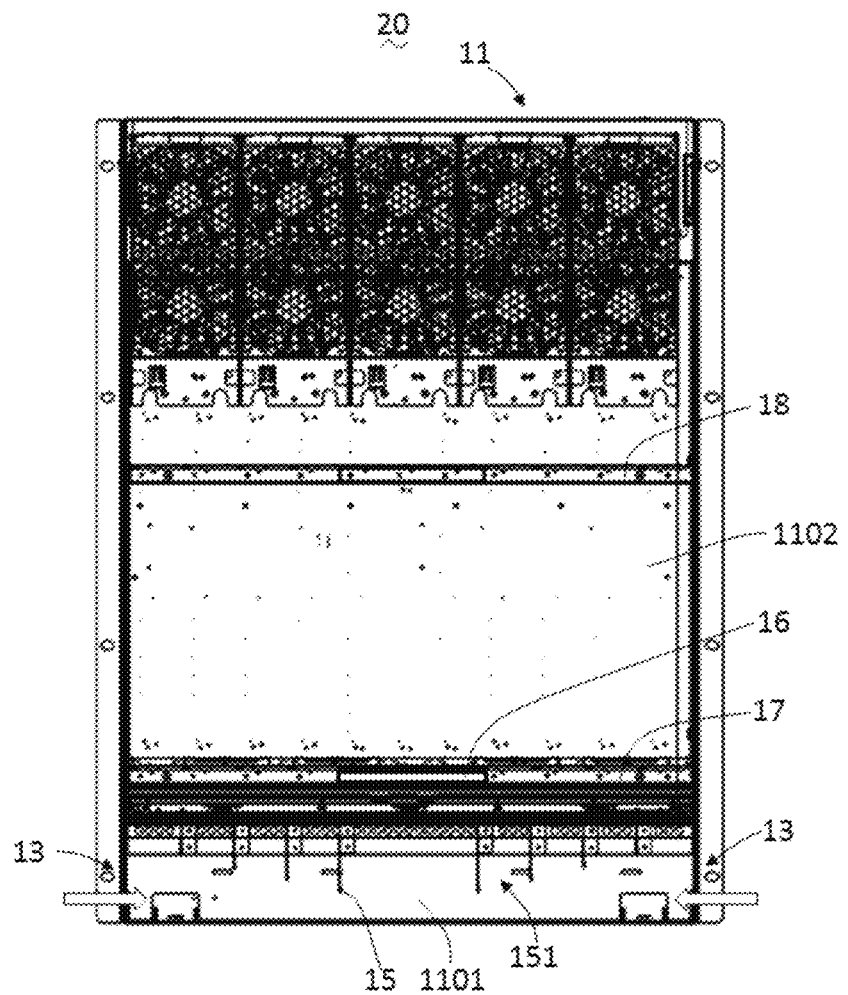
FIG. 6 is a front view of a a heat dissipation subrack according to a second embodiment of the present disclosure.
Figure 7:
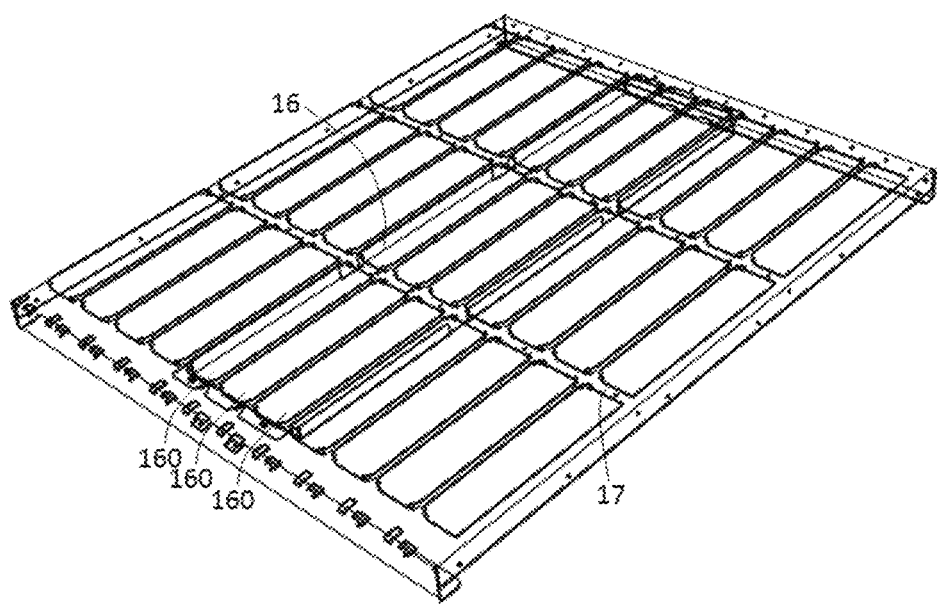
FIG. 7 is a schematic structural diagram of a perforated panel and a guide rail of the heat dissipation subrack illustrated in FIG. 6.

According to a second embodiment of the present disclosure, referring to FIG. 6 and FIG. 7, another heat dissipation subrack 20 is provided. The heat dissipation subrack 20 of the second embodiment is substantially the same as the heat dissipation subrack 10 of the first embodiment. The heat dissipation subrack 20 of the second embodiment also includes a cabinet body 11, an air inlet (not illustrated in the figure), air supplementing openings 13, and an air outlet (not illustrated in the figure), and a baffle 15 located in the cabinet body 11, where the air inlet, the air supplementing openings 13, and the air outlet are defined on the cabinet body. The heat dissipation subrack 20 and the heat dissipation subrack 10 differ in that the heat dissipation subrack 20 of the second embodiment further includes a perforated panel 16 illustrated in FIG. 7.

In embodiments, the heat source region 1102 is disposed adjacent to the air inlet region 1101. The perforated panel 16 is disposed at a junction of the air inlet region 1101 and the heat source region 1102. The perforated panel 16 defines at least one through hole 160. An upper end of the through hole 160 communicates with the heat source region 1102 and a lower end of the through hole 160 communicates with the air inlet region 1101. The perforated panel 16 is disposed directly facing the airflow passage 151 located at the central region of the air inlet region 1101. That is, a size of the perforated panel 16 in the first opening direction is the same as that of the airflow passage 151 located at the central region of the air inlet region 1101 in the first opening direction and a size of the perforated panel 16 in the second opening direction is the same as that of the airflow passage 151 located at the central region of the air inlet region 1101 in the second opening direction. In this way, the perforated panel 16 covers the airflow passage 151 located at the central region of the air inlet region 1101. The upper end of the through hole 160 communicates with the heat source region 1102 and the lower end of the through hole 160 communicates with the airflow passage 151 located at the central region of the air inlet region 1101. In an actual process, an air volume at the central region of the cabinet body 11 may be adjusted by controlling a size of each through hole 160 and an opening ratio of the through holes 160.

It can be understood that the perforated panel 16 may also traverse an entire horizontal cross-section of the cabinet body 11, so as to cover all the airflow passages 151. For each airflow passage 151, a group of the through holes 160 are defined in a corresponding region of the perforated panel 16 directly facing the airflow passage 151. The size and the opening ratio of the through holes are respectively set for each group of through holes 160, so that airflow volume at each position of the junction of the heat source region 1102 and the air inlet region 1101 may be adjusted.

In addition, it is to be noted that, in embodiments, there is a guide rail 17 provided at the junction of the air inlet region 1101 and the heat source region 1102, so as to carry a backplane having heating elements and provide slidable inserting for the backplane. Correspondingly, the perforated panel 16 may be disposed below the guide rail 17 and fixed on the guide rail 17. For example, the cabinet body 11 further includes a guide rail 18 disposed in the heat source region 1102 and located above the guide rail 17. The guide rail 17 and the guide rail 18 are disposed opposite to each other, to cooperatively fix the backplane. It can be understood that, there may be multiple guide rails 17 and guide rails 18, and the multiple guide rails 17 and the multiple guide rails 18 are in one-to-one correspondence, so as to fix multiple backplanes.

Figure 8:
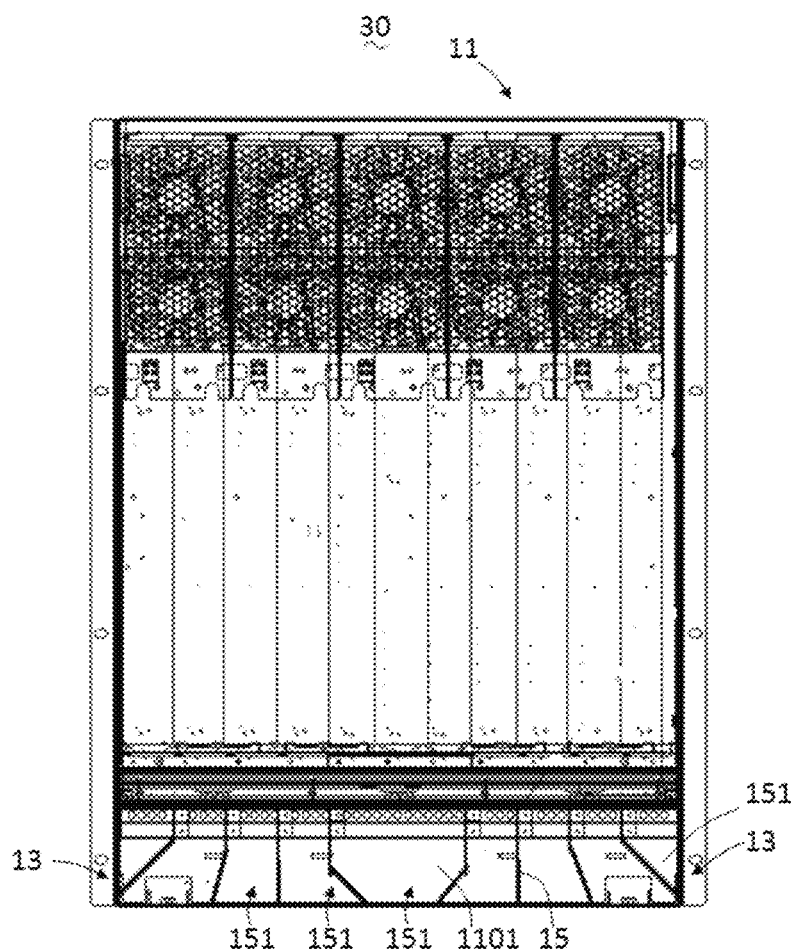
FIG. 8 is a front view of a heat dissipation subrack according to a third embodiment of the present disclosure.

According to a third embodiment of the present disclosure, referring to FIG. 8, another heat dissipation subrack 30 is provided. The heat dissipation subrack 30 of the third embodiment is substantially the same as the heat dissipation subrack 10 of the first embodiment. The heat dissipation subrack 30 also includes a cabinet body 11, an air inlet (not illustrated in the figure), air supplementing openings 13, an air outlet (not illustrated in the figure), and baffles 15 located in the cabinet body 11. The air inlet, the air supplementing openings 13, and the air outlet are disposed on the cabinet body. The heat dissipation subrack 30 and the heat dissipation subrack 10 differ in that the baffles 15 of the third embodiment isolate the multiple airflow passages 151 from each other, the air inlet (not illustrated) communicates with each of the airflow passages 151, and the air supplementing openings 13 communicates with at least part of the airflow passages 151 located at the non-central region of the air inlet region 1101. In this way, the multiple airflow passages 151 are completely isolated, such that squeezing of airflow of the air supplementing openings 13 on airflow of the air inlet located at the central region of the air inlet region 1101 may be completely eliminated.

It can be understood that the heat dissipation subrack 30 in the third embodiment may also be modified from the heat dissipation subrack 20 of the second embodiment. On the basis of the structure of the heat dissipation subrack 20, the baffles 15 are provided as follows. The airflow passages 151 are isolated from each other by the baffles 15, the air inlet (not illustrated) communicates with each of the airflow passages 151, and the air supplementing openings 13 communicates with at least the part of the airflow passages 151 located at the non-central region of the air inlet region 1101.

Figure 9:
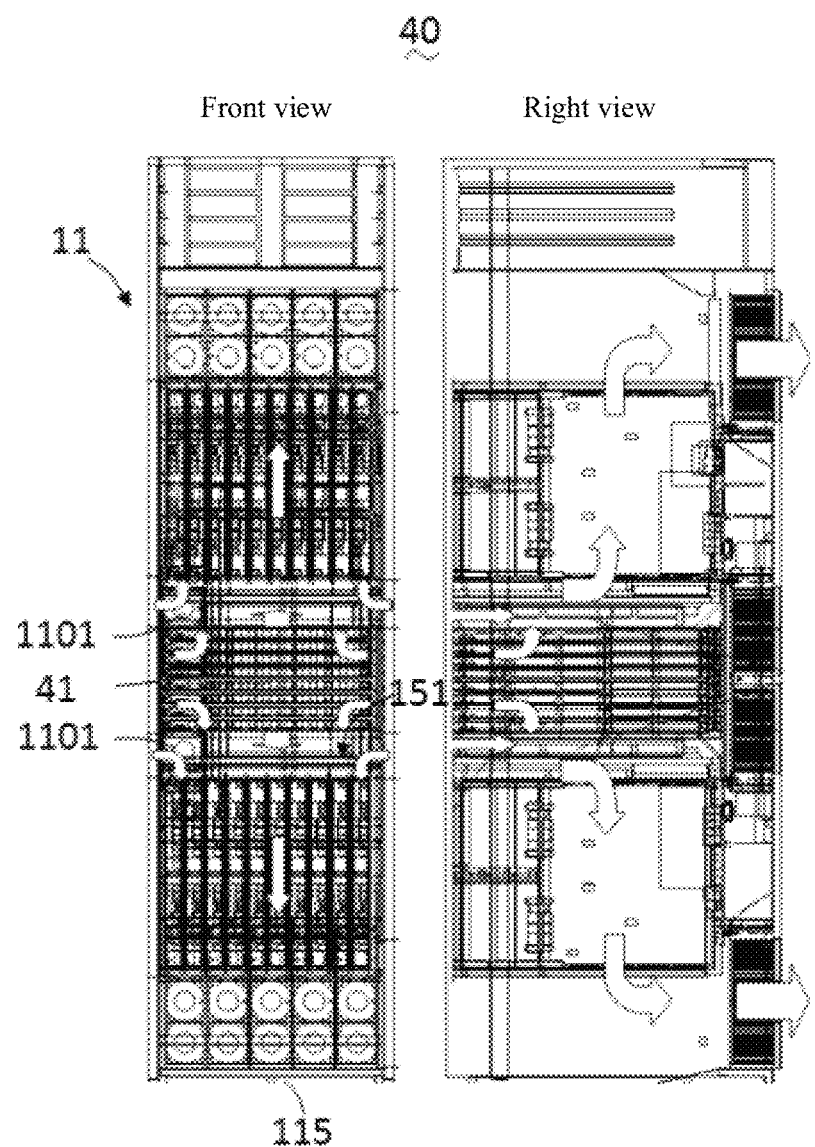
FIG. 9 is a front view and a right view of a heat dissipation subrack according to a fourth embodiment of the present disclosure.

According to a fourth embodiment of the present disclosure, referring to FIG. 9, a heat dissipation cabinet 40 is provided. The heat dissipation cabinet 40 includes two heat dissipation subracks 10 as described in the first embodiment. The cabinet body 11 of one of the two heat dissipation subracks 10 is stacked on the cabinet body 11 of the other of the two heat dissipation subracks 10. For example, the two cabinet bodies 11 in embodiments are arranged in opposite directions, so that structures of the two cabinet bodies 11 are symmetrical. Optionally, neither of the two cabinet bodies 11 is provided with the bottom panel 114 described in the first embodiment, and top panels 115 of the two cabinet bodies 11 are far away from each other.

Figure 10:
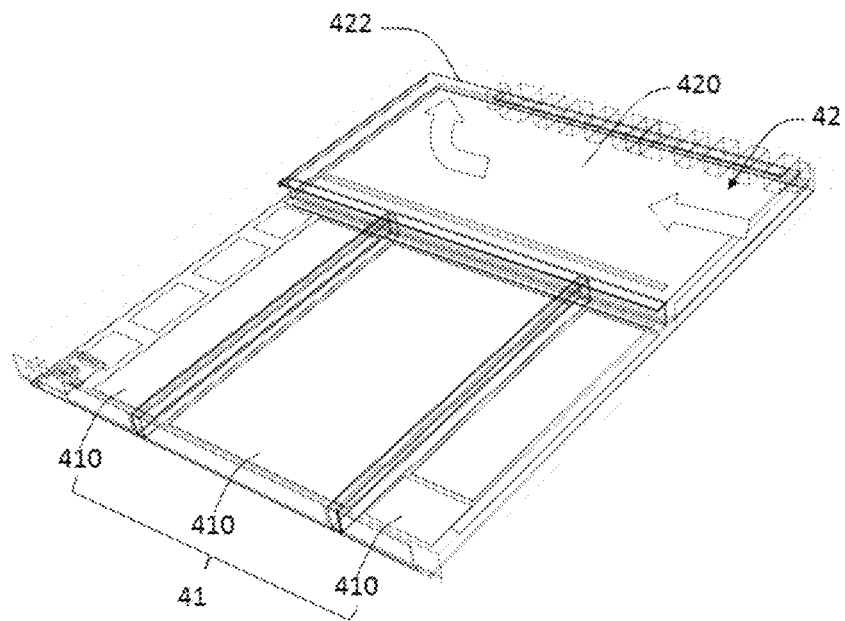
FIG. 10 is a schematic structural diagram of an air supplementing region and a heat dissipation region of the heat dissipation subrack illustrated in FIG. 9.

Since the two cabinet bodies 11 do not include the bottom panel 114, the air inlet region 1101 of one of the two cabinet bodies 11 is adjacent to and communicates with the air inlet region 1101 of the other of the two cabinet bodies 11. In order to further supplement an air volume and improve heat dissipation effect, in embodiments, an air supplementing region 41 may also be defined between the two cabinet bodies 11 (that is, between the two air inlet regions 1101). The air supplementing region 41 communicates with the air inlet regions 1101 of the two cabinet bodies 11, respectively. The air supplementing region 41 includes multiple air inlet passages 410 as illustrated in FIG. 10. The multiple air inlet passages 410 communicate with at least one of airflow passages 151 of multiple cabinet bodies 11, respectively.

In addition, the heat dissipation cabinet 40 may further include a heat dissipation region 42 that is defined between the two cabinet bodies 11 and adjacent to the air supplementing region 41. As illustrated in FIG. 10, the heat dissipation region 42 includes an airflow passage 420, and an inlet port 421 and an exhaust port 422 that communicate with the air passage 420, respectively. In embodiments, the inlet port 421 may be set to have a second opening direction, and the exhaust port 422 may be set to have a first opening direction (which is the same as an opening direction of the air outlet 14). The airflow passage 420 is substantially L-shaped. The heat dissipation region 42 may be used for accommodating a single board of the switch and realizing heat dissipation for the single board of the switch.

It is worth mentioning that, each of the two heat dissipation subracks 10 of the heat dissipation cabinet 40 may be replaced by the heat dissipation subrack 20 of the second embodiment or the heat dissipation subrack 30 of the third embodiment, and various structures replaced are not repeated herein.

Figure 11:
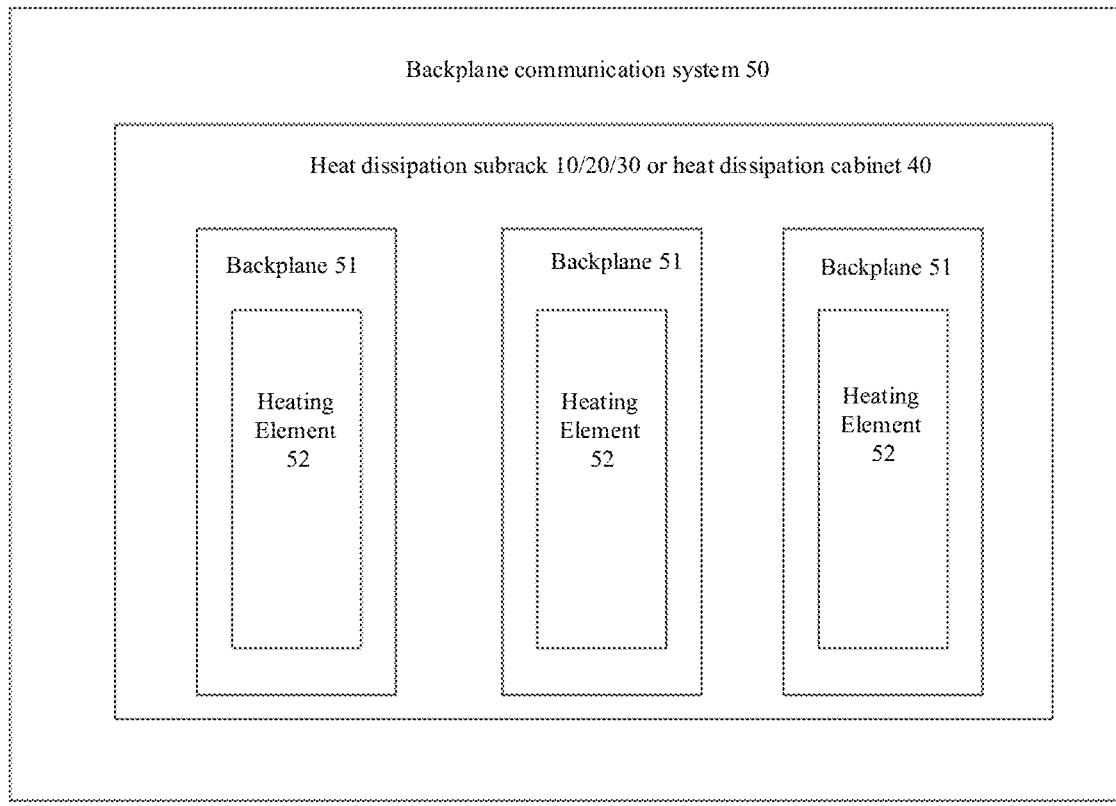
FIG. 11 is a schematic block diagram of a backplane communication system according to a fifth embodiment of the present disclosure.

According to a fifth embodiment of the present disclosure, referring to FIG. 11, a backplane communication system 50 is provided. The backplane communication system 50 includes the heat dissipation subrack 10, the heat dissipation subrack 20, the heat dissipation subrack 30, or the heat dissipation cabinet 40 defining the accommodating space 110 and described in the foregoing embodiments, multiple backplanes 51 disposed inside the accommodating space 110, and multiple heating elements 52, where each of the multiple heating elements 52 is disposed on a corresponding backplane 51.

Those of ordinary skill in the art can understand that the above-mentioned embodiments are specific embodiments for realizing the present disclosure, and in practical applications, various changes in form and details can be made without departing from the spirit and scope of the present disclosure.

What is claimed is:

1. A heat dissipation subrack, comprising a cabinet body defining an accommodating space, wherein the cabinet body defines an air inlet, two air supplementing openings, and an air outlet, wherein:

the accommodating space has an air inlet region directly facing the air inlet and the two air supplementing openings, and a heat source region communicatively coupled to the air inlet region; wherein the air inlet has a first opening direction, each of the two air supplementing openings has a second opening direction, and the first opening direction and the second opening direction intersect in the air inlet region; and the cabinet body comprises baffles disposed in the air inlet region and spaced apart from one another, wherein each of the baffles comprises two wind shielding surfaces, one of the two wind shielding surfaces faces one of the two air supplementing openings, the other of the two wind shielding surfaces faces the other of the two air supplementing openings, and areas of the wind shielding surfaces of the baffles increase sequentially along a direction away from the air supplementing openings, wherein airflow passages facing the air inlet and communicatively coupling the air inlet region to the heat source region are respectively defined between each two adjacent baffles as well as between one of inner walls of the cabinet body and the baffle adjacent to the one of the inner walls of the cabinet body.

2. The heat dissipation subrack according to claim 1, wherein the baffles are parallel to one another.

3. The heat dissipation subrack according to claim 2, wherein the first opening direction is parallel to the baffles.

4. The heat dissipation subrack according to claim 3, wherein the second opening direction is perpendicular to the baffles.

5. The heat dissipation subrack according to claim 4, wherein any two of the airflow passages has a same width in the second opening direction.

6. The heat dissipation subrack according to claim 4, wherein the airflow passage located at a central region of the air inlet region has a first width in the second opening direction, and at least one of the airflow passages that is located at a non-central region of the air inlet region has a second width in the second opening direction, wherein the first width is larger than the second width.

7. The heat dissipation subrack according to claim 1, wherein the baffles have a same length in the first opening direction, and the baffles have different heights in a direction perpendicular to the first opening direction and the second opening direction.

8. The heat dissipation subrack according to claim 3, wherein the baffles are symmetrically disposed on both sides of the airflow passage located at a central region of the air inlet region.

9. The heat dissipation subrack according to claim 1, wherein the heat source region is adjacent to the air inlet region and communicates the air inlet region and the air outlet; wherein
the cabinet body further comprises a perforated panel that is disposed at a junction of the air inlet region and the heat source region and defines a plurality of through holes, wherein each of the plurality of through holes communicates the heat source region and the airflow passages.

10. The heat dissipation subrack according to claim 9, wherein a size of the perforated panel in the first opening direction is the same as that of the airflow passage located at a central region of the air inlet region in the first opening direction, and a size of the perforated panel in the second opening direction is the same as that of the airflow passage located at the central region of the air inlet region in the second opening direction, wherein the perforated panel covers the airflow passage located at the central region of the air inlet region, and each of the plurality of through holes communicates the heat source region and the airflow passage located at the central region of the air inlet region.

11. The heat dissipation subrack according to claim 1, wherein the heat source region is adjacent to the air inlet region and communicates the air inlet region and the air outlet, wherein the cabinet body further comprises at least one first guide rail disposed at a junction of the air inlet region and the heat source region.

12. The heat dissipation subrack according to claim 11, wherein the cabinet body further comprises at least one second guide rail disposed in the heat source region and above the at least one first guide rail, wherein the at least one second guide rail is disposed opposite to the at least one first guide rail.

13. The heat dissipation subrack according to claim 1, wherein the baffles isolate the airflow passages from one another, the air inlet communicates with each of the airflow passages, and each of the air supplementing openings communicates with at least part of airflow passages located at a non-central region of the air inlet region.

14. A heat dissipation cabinet, comprising two heat dissipation subracks, wherein each of the two heat dissipation subracks comprises:
a cabinet body defining an accommodating space, wherein the cabinet body defines an air inlet, two air supplementing openings, and an air outlet, wherein
the accommodating space has an air inlet region directly facing the air inlet and the two air supplementing openings, and a heat source region communicatively coupled to the air inlet region; wherein the air inlet has a first opening direction, each of the two air supplementing openings has a second opening direction, and the first opening direction and the second opening direction intersect in the air inlet region; and
the cabinet body comprises baffles disposed in the air inlet region and spaced apart from one another, wherein each of the baffles comprises two wind shielding surfaces, one of the two wind shielding surfaces faces one of the two air supplementing openings, the other of the two wind shielding surfaces faces the other of the two air supplementing openings, and areas of the wind shielding surfaces of the baffles increase sequentially along a direction away from the air supplementing openings, wherein airflow passages facing the air inlet and communicatively coupling the air inlet region to the heat source region are respectively defined between each two adjacent baffles as well as between one of inner walls of the cabinet body and the baffle adjacent to the one of the inner walls of the cabinet body;
wherein the cabinet body of one of the two heat dissipation subracks is stacked on the cabinet body of the other of the two heat dissipation subracks.

15. The heat dissipation cabinet according to claim 14, wherein the two cabinet bodies are symmetrically arranged.

16. The heat dissipation cabinet according to claim 14, further comprising an air supplementing region defined between the two cabinet bodies and communicatively coupled to the air inlet regions of the two cabinet bodies, respectively; wherein the air supplementing region defines at least one airflow passage, an inlet port communicatively coupled to the at least one airflow passage in the heat dissipation region, and an exhaust port communicatively coupled to the at least one airflow passage in the heat dissipation region.

17. The heat dissipation cabinet according to claim 14, further comprising a heat dissipation region defined between the two cabinet bodies and adjacent to an air supplementing region, wherein the heat dissipation region has at least one first airflow passage, and an inlet port and an exhaust port that respectively communicate with the at least one airflow passage in the heat dissipation region.

18. The heat dissipation cabinet according to claim 17, wherein the inlet port has the second opening direction, the exhaust port and the air outlet have a same opening direction, and the at least one airflow passage in the heat dissipation region is L-shaped.

19. A backplane communication system, comprising at least one backplane, at least one heating element disposed on the at least one backplane, and a heat dissipation subrack, wherein the at least one backplane is disposed in an accommodating space, wherein the heat dissipation subrack comprises:
a cabinet body defining the accommodating space, wherein the cabinet body defines an air inlet, two air supplementing openings, and an air outlet, wherein
the accommodating space has an air inlet region directly facing the air inlet and the two air supplementing openings, and a heat source region communicatively coupled to the air inlet region; wherein the air inlet has a first opening direction, each of the two air supplementing openings has a second opening direction, and the first opening direction and the second opening direction intersect in the air inlet region; and the cabinet body comprises baffles disposed in the air inlet region and spaced apart from one another, wherein each of the baffles comprises two wind shielding surfaces, one of the two wind shielding surfaces faces one of the two air supplementing openings, the other of the two wind shielding surfaces faces the other of the two air supplementing openings, and areas of the wind shielding surfaces of the baffles increase sequentially along a direction away from the air supplementing openings, wherein airflow passages facing the air inlet and communicatively coupling the air inlet region with the heat source region are respectively defined between each two adjacent baffles as well as between one of inner walls of the cabinet body and the baffle adjacent to the one of the inner walls of the cabinet body.

* * * * *